United States Patent
Madocks

(10) Patent No.: US 7,025,833 B2
(45) Date of Patent: Apr. 11, 2006

(54) APPARATUS AND METHOD FOR WEB COOLING IN A VACUUM COATING CHAMBER

(75) Inventor: John Madocks, Tucson, AZ (US)

(73) Assignee: Applied Process Technologies, Inc., Tucson, AZ (US)

( * ) Notice: Subject to any disclaimer, the term of this patent is extended or adjusted under 35 U.S.C. 154(b) by 277 days.

(21) Appl. No.: 10/471,107

(22) PCT Filed: Feb. 27, 2002

(86) PCT No.: PCT/US02/05679

§ 371 (c)(1),
(2), (4) Date: Sep. 5, 2003

(87) PCT Pub. No.: WO02/070778

PCT Pub. Date: Sep. 12, 2002

(65) Prior Publication Data

US 2004/0074443 A1   Apr. 22, 2004

(51) Int. Cl.
*C23C 16/00* (2006.01)
*C23C 16/458* (2006.01)
*C23C 14/24* (2006.01)
*C23C 16/54* (2006.01)

(52) U.S. Cl. .................. 118/733; 118/718; 118/724; 427/248.1; 427/255.24

(58) Field of Classification Search .............. None
See application file for complete search history.

(56) References Cited

U.S. PATENT DOCUMENTS

| | | | |
|---|---|---|---|
| 3,414,048 A | 12/1968 | Rall | 165/1 |
| 3,924,563 A * | 12/1975 | Kessler et al. | 118/718 |
| 4,723,507 A * | 2/1988 | Ovshinsky et al. | 118/718 |
| 5,076,203 A | 12/1991 | Vaidya et al. | 118/718 |
| 5,395,647 A | 3/1995 | Krug | 427/172 |
| 5,743,966 A | 4/1998 | Woolley et al. | 118/718 |
| 2004/0074443 A1* | 4/2004 | Madocks | 118/718 |

FOREIGN PATENT DOCUMENTS

JP   2002-212744   * 7/2002

* cited by examiner

*Primary Examiner*—Jeffrie R. Lund
(74) *Attorney, Agent, or Firm*—Cahill, von Hellens & Glazer, P.L.C.

(57) ABSTRACT

A chill drum (14) is modified to improve heat transfert between the drum and a flexible web substrate (20) disposed around the drum. The drum surface (22) contains a series of passages (44) and distribution holes (46). A working gas is injected into these passages and flows out of the distribution holes into the space between the web and drum. A cover (32) prevents working gas from escaping from frum passages in the area not covered by the web, and supplies the working gas to the passages at the drum cover. Once gas is in the passages, leakage only occurs from the edges of the web. The pressure in the passages remains essentially constant around the drum, producing uniform elevated pressures under the entire web. Elevated pressure behind the web significantly improves overall heat transfert, thereby allowing higher deposition rates and other process advantages.

13 Claims, 10 Drawing Sheets

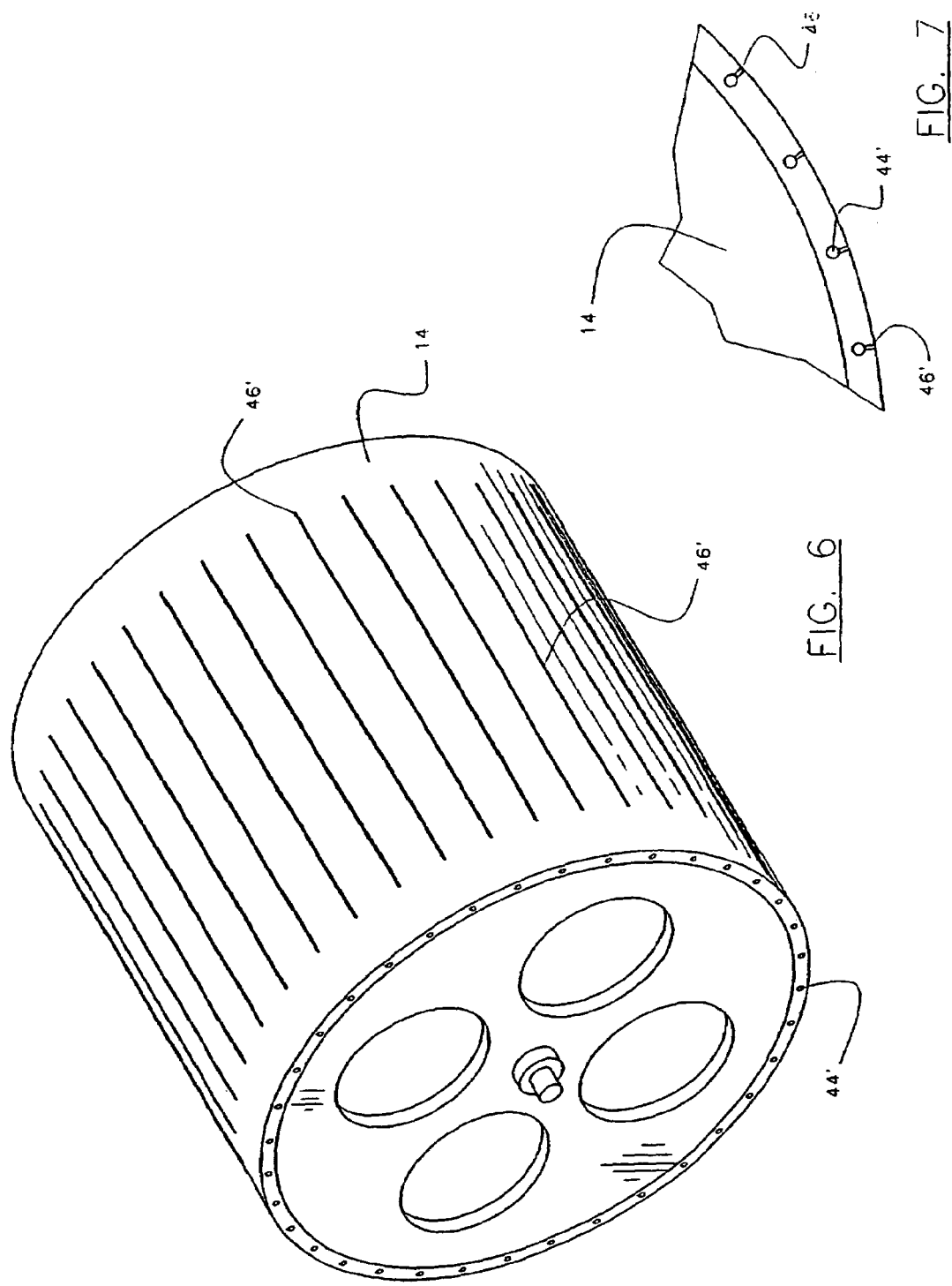

APPARATUS AND METHOD FOR WEB COOLING IN A VACUUM COATING CHAMBER

BACKGROUND

This invention relates to a device and method for improving heat transfer between a web and a chill drum in a vacuum chamber.

Many vacuum deposition processes involving flexible web substrates are accomplished with the web disposed around a rotating chilled drum. In these systems, deposition sources are arrayed around the drum and continuously deposit coatings onto the moving web. A limiting parameter of these deposition processes is the heat imparted to the web during the coating process. If the heat applied by the process exceeds maximum web parameters, the web wrinkles or is otherwise damaged. Many products today are either expensive or are not produced because of low deposition rates dictated by insufficient web heat transfer.

Heat removal from a web to a chilled drum is primarily limited by the interface between the web and drum. In this interface, heat is transferred by three modes. One mode is conduction between the two surfaces. Typical polymer webs are not smooth at the micron level. They are made intentionally rough to allow the film to be wound on a spool. While improving ease of handling, this surface roughness greatly reduces the actual contact between the web and the drum. Lack of contact in turn limits the heat transfer by conduction to less than 5% of the total heat transfer. A second heat transfer mode is radiation. While also contributing to heat removal, heat removed by this mode is limited by the relatively small temperature difference possible between the web and drum.

The third and largest contributor to heat transfer between the web and drum is molecular conduction. This mode occurs when molecules trapped between the web and drum transfer heat between the two surfaces. Commonly water vapor is present in polymer substrate films and devolves from the substrate during the deposition process. A portion of this water vapor is trapped between the web and drum and provides a medium for molecular conduction heat transfer. Important factors determining the rate of molecular conduction heat transfer include: the temperature of the web and drum, the web and drum materials, the type of gas, and the pressure of the gas. Variations to web and drum temperatures and materials are limited by materials properties; however, a significant opportunity for improvements in heat transfer resides with the type of gas and the pressure of the gas. If these variables can be optimized, the heat load into the web can be increased without damage to the web. Because the pressure can be varied by orders of magnitude, it offers the best lever for dramatic heat transfer improvement.

Several prior-art devices have attempted to improve the web-to-drum heat transfer by elevating the pressure between the web and drum:

U.S. Pat. No. 3,414,048 (Rall) discloses a drum with built in normally closed valves. Web in contact with the drum forces open the valves, allowing gas to flow into the gap between the web and drum. This apparatus is complicated with many parts to stick or fail. Also a thin polymer web may fail to exert sufficient pressure on the valve to open them. Other limitations of this approach include hot spots on the web (the valves are not cooled) and non-uniformity of web cooling.

U.S. Pat. No. 5,076,203 (Vaidya) discloses apparatus to increase the pressure behind the web by blowing gas into the gap with a nozzle arrangement. Another method to increase pressure employs a porous metal non-rotating section through which gas is distributed. An enclosure around the web and drum at the entrance point of the web is shown as a means to limit the increase in chamber pressure as gas is urged into the gap. While informative, several faults limit the utility of this device and method:

No means is described to continually trap working gas behind the web in a rotating drum configuration. Due to the minute quantity of gas trapped as the drum rotates away from the nozzle area, most or all trapped gas is lost before reaching the rewind side of the chamber. Therefore, the enclosure that is used to prevent gas from raising the system pressure only envelopes the unwind drum side. This indicates the small amount of gas actually urged into the web. High pressures would result in large gas loads on the chamber vacuum system.

No means is disclosed to bring a working gas into a porous material where the porous material is applied to the surface of a rotating drum.

No means is disclosed to alter the pressure effectively across the width of the web for the purpose of controlling web heat transfer and conveyance parameters. Distribution of gas in the porous surfaces is across the width of the drum.

In U.S. Pat. No. 5,395,647 (Krug), a vapor such as water is condensed onto the web prior to contact with the chill drum. While recognizing the need to improve heat transfer between the web and drum, this method lacks practicality for most deposition processes. The use of liquid water creates an undesirably large gas load on the pumping system, and uniformly dispensing of water vapor in vacuum is difficult. While clean and of a suitable vapor pressure, water vapor is detrimental to the formation of many desirable films. If a low vapor pressure fluid other than water is used, the web becomes contaminated with the substance.

SUMMARY

By way of general introduction, the web coating apparatus described below includes a rotatable drum that carries a web past a coating deposition station in a vacuum chamber. Tension on the web presses it against the drum over a first arc that includes the coating region of the apparatus, and the web is spaced from the drum in a second arc disposed opposite the coating deposition station. The drum is chilled, as for example with conventional liquid cooling, and the drum is provided with an array of passages. These passages open out onto the web support surface via exit portions that are continuously open. A source of pressurized gas is coupled with these passages such that pressurized gas is pumped via the passages and the exit portions into the region between the web and the drum. This pressurized gas improves heat transfer between the web and the drum.

In order to reduce undesired leakage of gas out of the passages over the arc of the drum not covered by the web, a set of seals is provided. These seals seal the exit portions of the passages in a sealing region disposed opposite the coating deposition station. These seals can slide over the working surface of the drum (or alternately they can seal without contacting the working surface of the drum or the web that is supported by the working surface of the drum), thereby preventing pressurized gas in the passageways from escaping out of the drum into the region of the vacuum chamber adjacent the coating deposition station.

The foregoing paragraphs have been provided by way of general introduction, and they are not intended to narrow the scope of the following claims.

BRIEF DESCRIPTION OF THE DRAWINGS

FIG. 6 is a fragmentary perspective view of another alternative drum suitable for use with this invention.

FIG. 7 is a fragmentary cross-sectional view taken along line 7—7 of FIG. 6.

DETAILED DESCRIPTION OF THE PRESENTLY PREFERRED EMBODIMENTS

General Discussion

Figure 1:
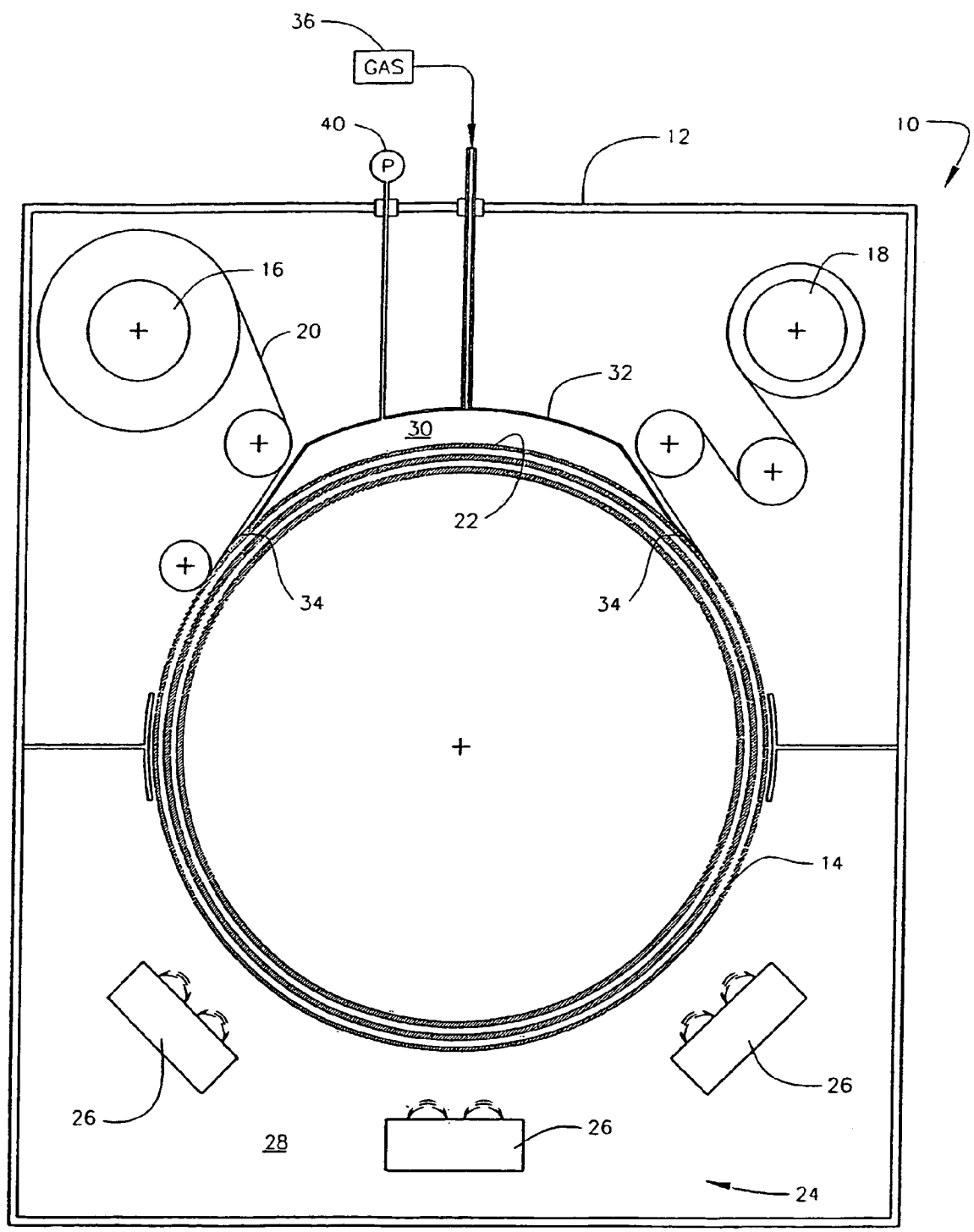
FIG. 1 is a partially schematic plan view of a web coating apparatus that incorporates a first preferred embodiment of this invention.

The present invention relates to an improved apparatus and method for increasing heat transfer between a flexible web and a chill drum in a vacuum chamber. This invention is particularly useful in improving heat transfer in systems employing sources to deposit coatings onto the web.

In one embodiment, a liquid-cooled drum is constructed with a series passages around the drum perimeter with connecting tubes to the surface of the web. These passages and tubes are proximal to the surface and are separate from the liquid cooling. A working gas is constantly introduced into the passages, raising the pressure inside the passages. The passages are of a sufficient size such that the conductance of the passages far exceeds the leakage conductance from the edges of the web. For this reason, the passage pressure remains essentially constant through the entire length of the passage around the drum. Connecting tubes between the passages and drum surface allow gas to flow into the gap between the web and drum. The conductance limitation is the leakage from the edges of the web, and the pressure under the web therefore equals passage pressure. For example, pressures of 10 Torr or greater can be maintained between the web and drum while deposition zone pressures remain in the $5 \times 10^{-4}$ Torr range. This is achieved because only a minimal gas load is added to the deposition zone vacuum pumping requirements. This embodiment has several significant benefits, and it makes feasible previously-unachievable deposition rates and processes. These benefits include the following:

The working gas is distributed to produce a uniform pressure around the entire drum perimeter rather than only at one deposition zone. Effective heat removal is possible with systems employing multiple deposition sources installed around the drum (e.g. multiple sputter cathodes).

Pressure behind the web can optionally be controlled across the width of the web to optimize heat transfer, pumping loads and web effects such as wrinkling.

With uniform gas distribution and pressure behind the web, local web tension variations are mitigated. In typical chill drum deposition systems, hot spots on the web cause local web expansion and loss of optimum thermal contact. Web wrinkling and other permanent damage can result. The constant pressure delivered by the gas distribution network described below reduces hot spot occurrences.

The pumping load on the vacuum system is minimized. While considerable pressure can be maintained in the gap between the web and drum, only a small gas load is added to the vacuum system. For example, With a typical ~2 um gap between the web and drum due to web and/or drum roughness, a 10 Torr passage pressure leaks at only 0.002 Torr-liter/sec into the chamber.

The modifications required to a drum and web coater do not rule out retrofit to an existing coater. Extensive pumping and winding changes are not required. A standard construction chill drum can be modified with a network of passages and holes. The sealing and gas inlet cover can be retrofitted into an existing system, and the increased gas load on the vacuum pumps is minimal.

Rather than accept water vapor already in the web as the only heat transfer agent, a choice of gases can be used. In some cases a process gas can be used, e.g. the gas for sputter deposition. In this example the leakage from the web edges becomes part of the process gas delivery system.

Specific Implementations

Turning now to the drawings, FIG. 1 shows a schematic plan view of a web coating apparatus 10 that includes a vacuum chamber 12. Mounted inside the vacuum chamber 12 are a rotatable drum 14 and winding hubs 16, 18. A web 20 to be coated is initially wound on the winding hub 16 and is wrapped partially around the drum 14, supported by a web support surface 22 of the drum 14. The rotating drum 14 transports the web 20 from the winding hub 16 past a coating deposition station 24 to the winding hub 18. The coating deposition station 24 can include one or more sources 26. In this example three sputter cathode magnetron sources are used, though more or fewer sources can be used of any suitable type. The region of the vacuum chamber 12 in the vicinity of the coating deposition station 24 will be referred to in the following description as a coating region 28.

The web coating apparatus 10 also includes a sealed region 30 that extends over an arc of the drum 14 that is angularly spaced from the coating region 28 and the coating deposition station 24. In this example, the sealed region 30 is bounded by a drum cover 32 that includes sliding seals 34 that slide against the web support surface 22 immediately adjacent the two lines of contact between the web 20 and the web support surface 22 as the web 20 approaches the drum 14 on one side of the drum cover 32 and moves away from the drum 14 on the other side of the drum cover 32.

In this example, a source 36 of pressurized gas is in fluid communication with the sealed region 30 bounded by the drum cover 32 and the web support surface 22 of the drum 14. A pressure gauge 40 allows the pressure of gas in the region 30 to be monitored.

Figure 2:
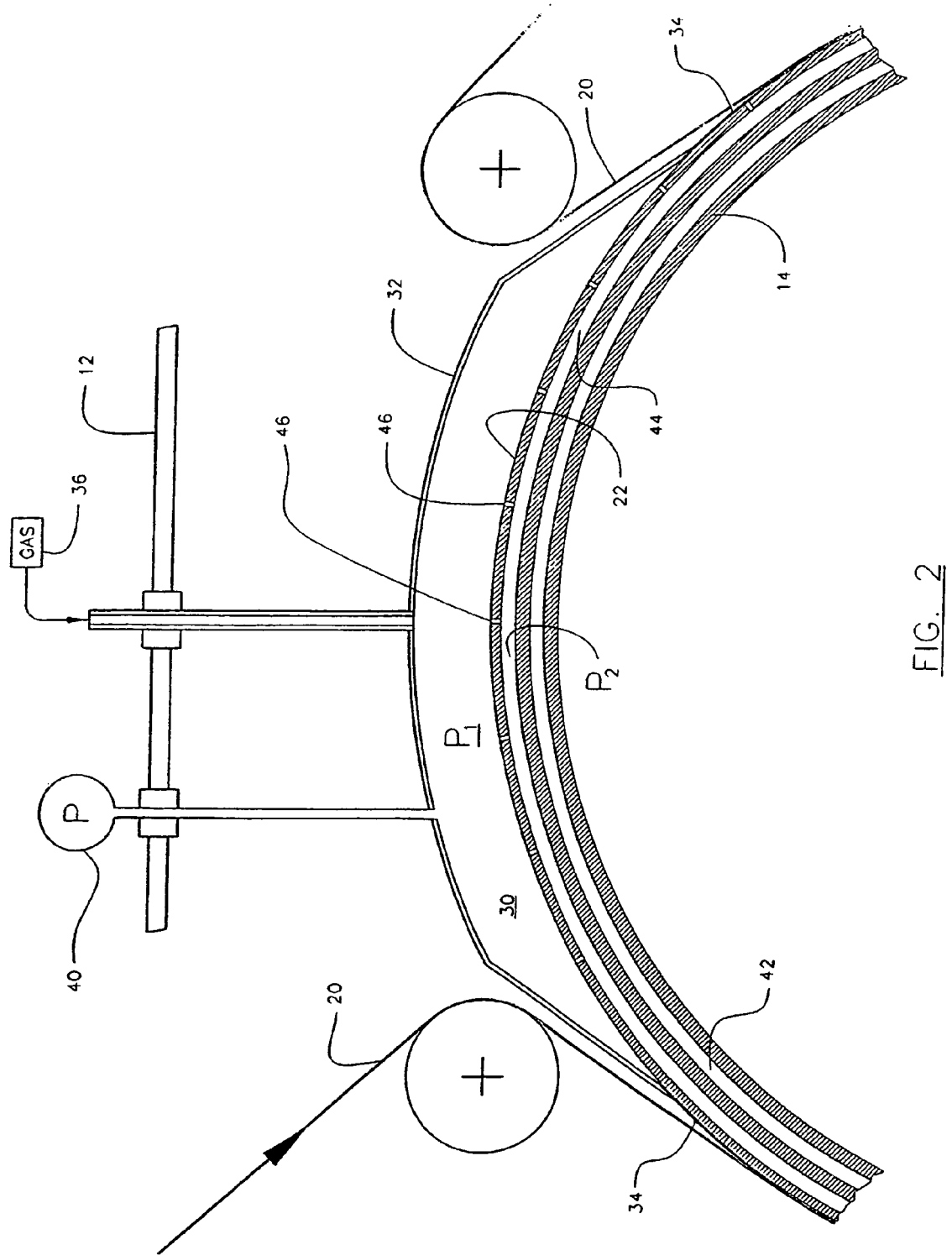
FIG. 2 is an enlarged view of selected portions of the apparatus of FIG. 1.

FIG. 2 provides an enlarged view that shows the relationship between the drum cover 32, the sliding seals 34 and the drum 14. As shown in FIG. 2, the drum 14 includes liquid cooling passages 42 through which a cooling liquid is pumped by conventional means (not shown). In this example, the drum 14 also includes an array of passages 44. Each passage 44 extends circumferentially completely around the drum 14, and each of the passages 44 is in fluid communication with the region immediately radially outwardly spaced from the web support surface 22 via exit portions 46. In this embodiment, the exit portions 46 are each shaped as a respective connecting tube that is constantly open between the circumferential passage 44 and the exterior of the drum 14. With this arrangement, the drum cover 32 and the sliding seals 34 seal the exit portions 46 in the region of the web support surface 22 not covered by the web 20. The web 20 itself seals the exit portions 46 over the arc of the web support surface 22 covered by the web 20.

In this embodiment, the pressurized gas from the source 36 passes into the region 30 bounded by the drum cover 32 and creates a working pressure P1. The pressure P1 is greater than the pressure P2 in the passages 44, such that the pressurized gas continuously flows from the source 36 through the region 30 and the exit portions 46 into the passages 44. The drum cover 32 cooperates with the web 20 to contain the pressurized gas at an elevated pressure inside the passages 44. Working gas is continually flowing into these passages via the region 30, thereby making up leakage loss and maintaining a substantially constant pressure P2 in all of the passages 44. In this way, gas pressure in the passages 44 is maintained at a substantially uniform level at all points of contact between the web 22 and the drum 14.

Figure 3:
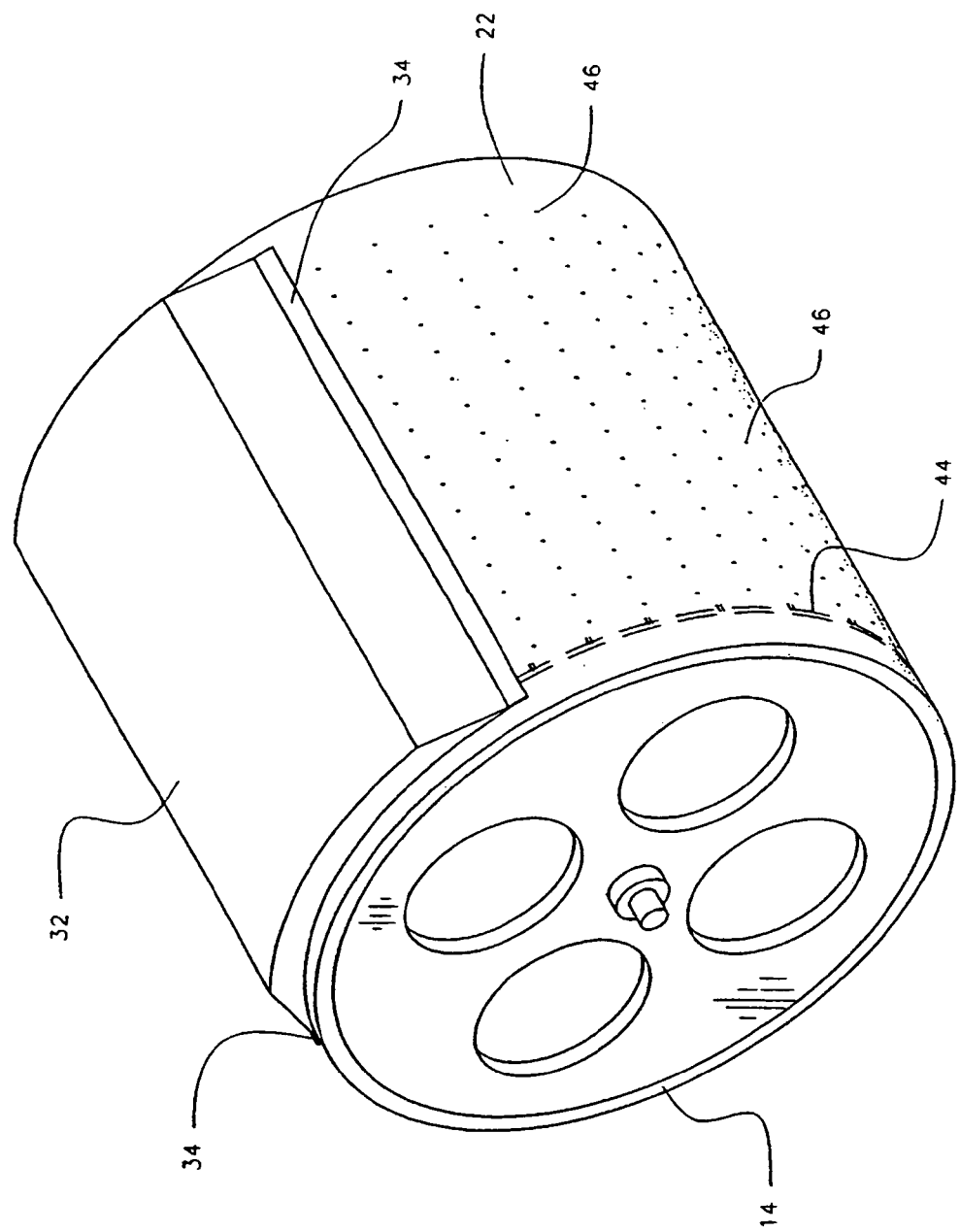
FIG. 3 is a perspective view of the drum and drum cover of the apparatus of FIGS. 1 and 2.

FIG. 3 shows a perspective view of the drum 14 and the drum cover 32. The exit portions 46 in the web support surface 22 are illustrated, as is one of the passages 44. Though not shown, a similar passage 44 is positioned under each of the exit portions 46. In this example, the passages 44 are circumferentially oriented and extend around the entire perimeter of the drum 14, and the exit portions 46 are shaped as small tubes. As shown in FIG. 3, the sliding seals 34 at the edges of the drum cover 32 are in direct sliding contact with the web support surface 22 of the drum 14. The spacing for the passages 44 and the exit portions 46 is determined by the heat transfer requirements of the particular application. In this embodiment, the drum cover 32 acts as a manifold coupling the source of pressurized gas with the exit portions 46 positioned in the sealed region 30 under the drum cover 32. In one example, the drum cover 30 and the associated manifold extend over the entire working width of the drum 14.

Figure 4:
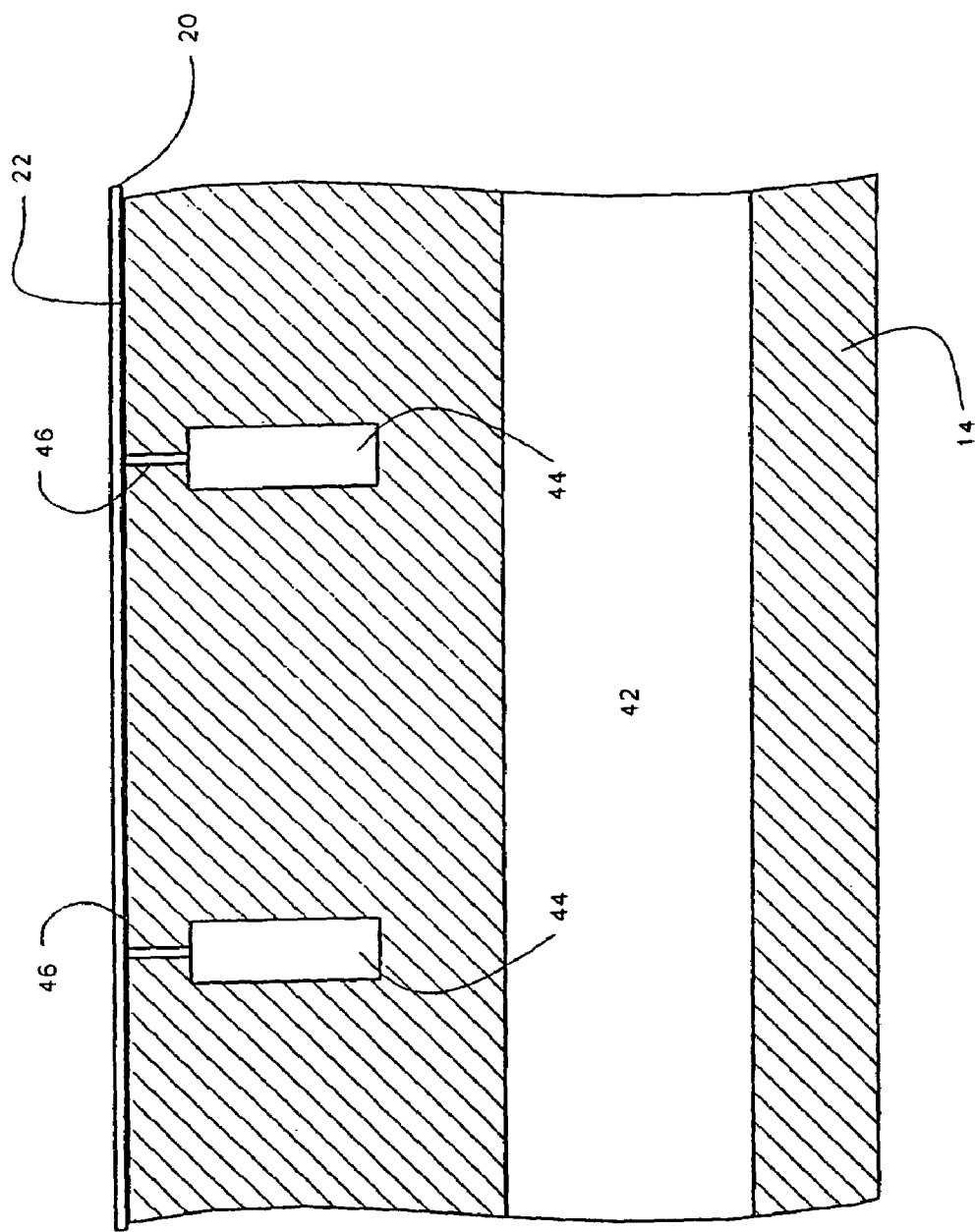
FIG. 4 is a cross-sectional view taken along line 4—4 of FIG. 2.

FIG. 4 provides an enlarged sectional view of two of the passages 44 and two of the exit portions 46. The passages 44 ring the web support surface 22 and are of a depth and width such that the conductance loss through each passage 44 is small compared to the loss through the gap between the web 20 and the drum 14. In this way, the pressure in each of the passages 44 is maintained at a substantially constant level along the entire length of the passage 44 around the drum 14.

The exit portions 46 are small in comparison to the passages 44, and the exit portions 46 connect the passages 44 to the web support surface 22. The exit portions 46 are sized to present a sufficient conductance for gas to flow from the sealed region into the passages 44 while minimizing the effects on the web 20 caused by interruptions in the web support surface 22. The spacing of the passages 44 across the width of the drum 14 and the spacing of the exit portions 46 around the perimeter of the drum 14 are selected to create the desired pressure distribution under the web 20. In one embodiment, the passages 44 and exit portions 46 are spaced to provide substantially constant pressure in the entire region between the web 20 and the drum 14. In another embodiment, the passages 44 and the exit portions 46 are spaced more closely in one portion of the web support surface 22 than another, axially-spaced portion of the web support surface 22. This design produces elevated pressures of selected gasses in a selected pressure distribution pattern under the web 20.

Figure 5:
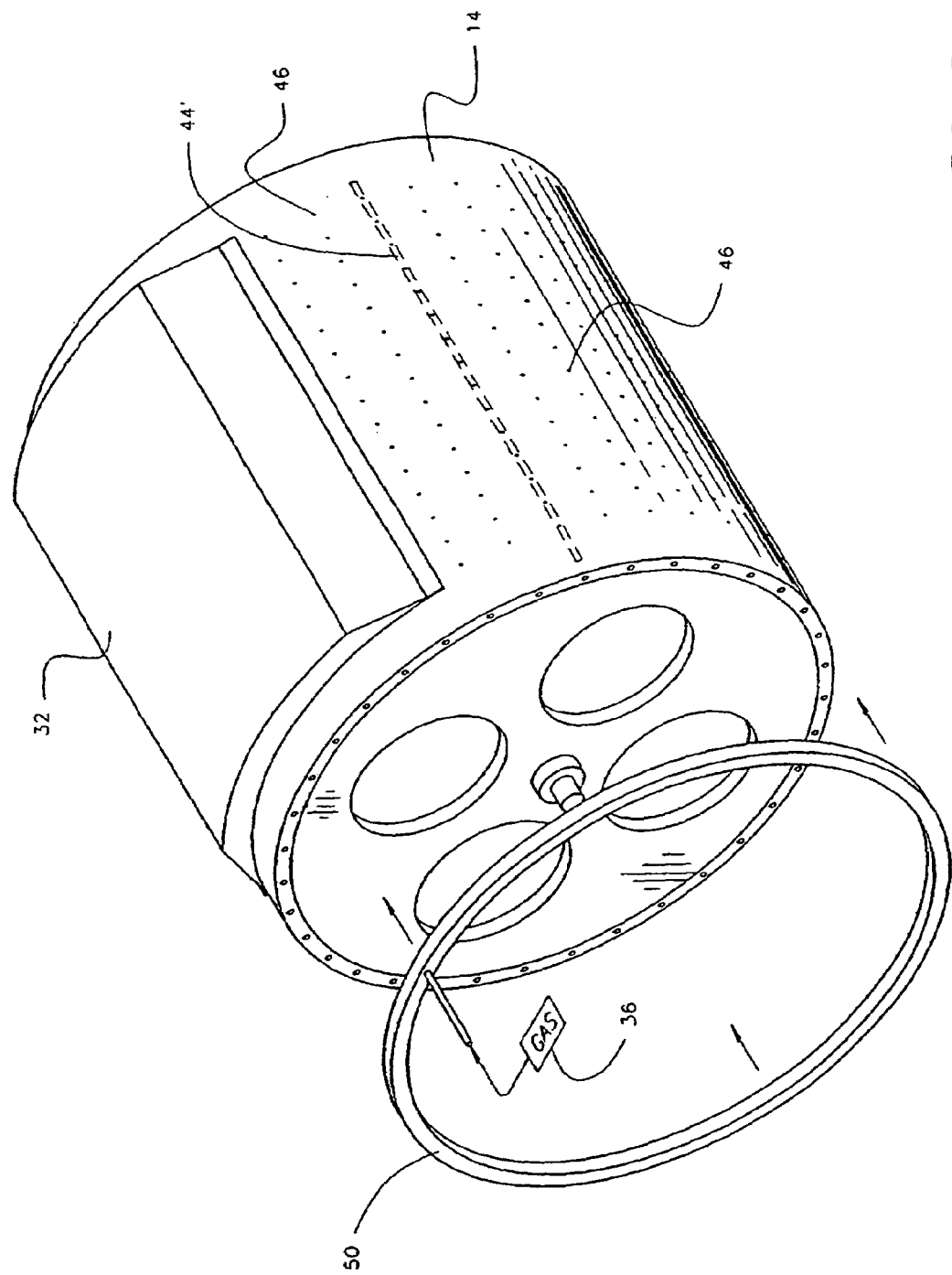
FIG. 5 is an exploded perspective view of an alternative drum suitable for use in the apparatus of FIG. 1.

Of course, many variations are possible to the preferred embodiment described above. As shown in FIG. 5, the drum 14 can be provided with passages 44' that extend axially along the length of the drum 14 rather than circumferentially as described above. In this case pressurized gas is introduced into the passages 44' via a manifold 50 at one end of the drum 14. In this case, the drum cover 32 does not require connection to the source of pressurized gas.

As shown in FIG. 6, the exit portions 46' may be shaped as elongated slits rather than the tubes described above. In general, the passages 44, 44' can be oriented at any desired angle rather than simply at the circumferential and axial angles illustrated and discussed above, and the exit portions 46, 46' can be shaped as any desired combination of tubes, slits, and other elongated shapes extending partially or fully along the length of the associated passages.

Figure 8:
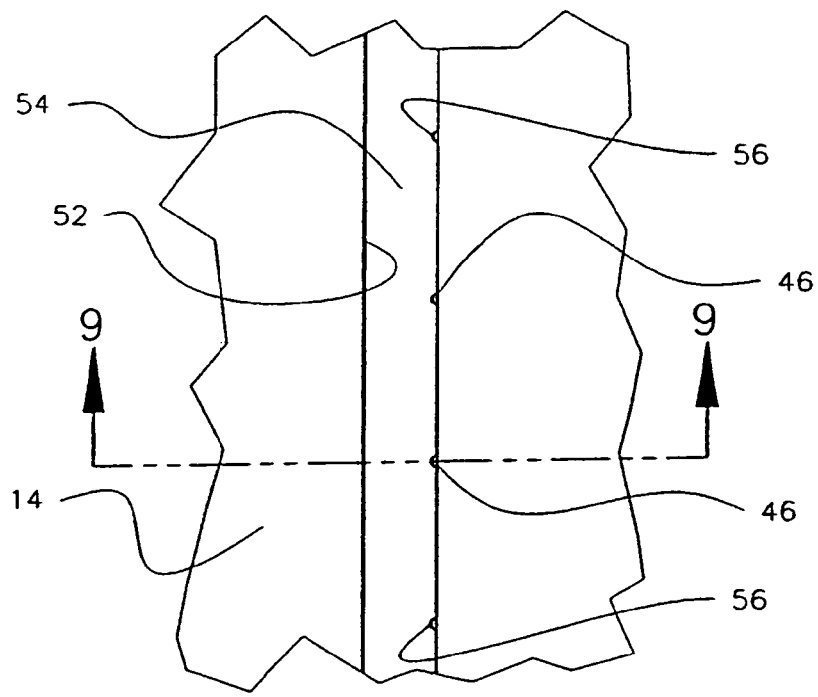
FIG. 8 is a fragmentary plan view of a portion of the web support surface of another preferred embodiment.
Figure 9:
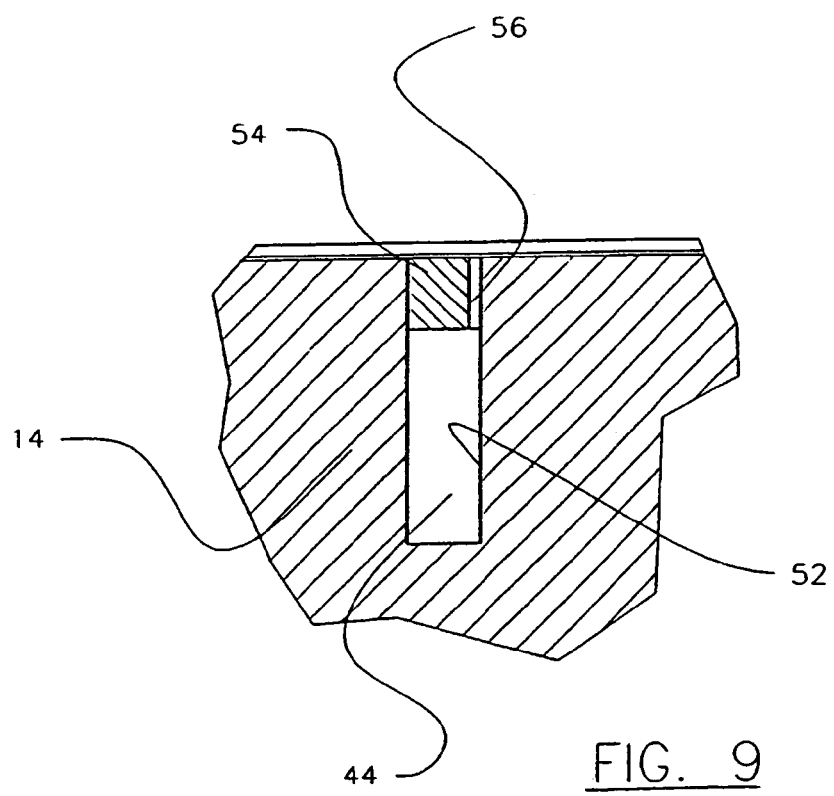
FIG. 9 is a cross-sectional view taken along line 9—9 of FIG. 8.

FIGS. 8 and 9 relate to one method for forming the passages 44. In this example the drum 14 is first provided with a groove 52, and this groove 52 is then sealed with a strip 54 that includes indentations 56. These strips 54 and indentations 56 cooperate with the adjacent drum 14 to form the passages 44 and the exit portions 46.

Figure 10:
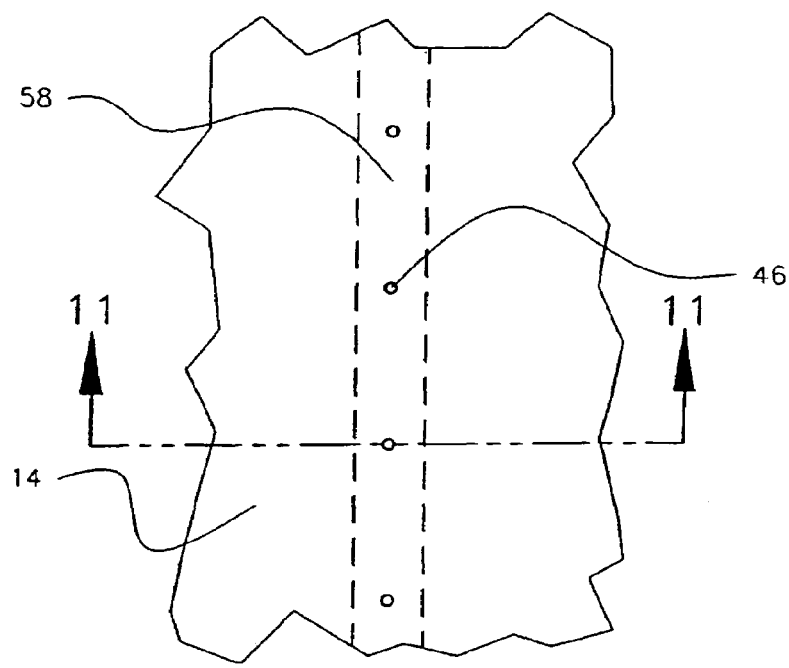
FIG. 10 is a fragmentary plan view of a portion of the web support surface of yet another alternative embodiment of this invention.
Figure 11:
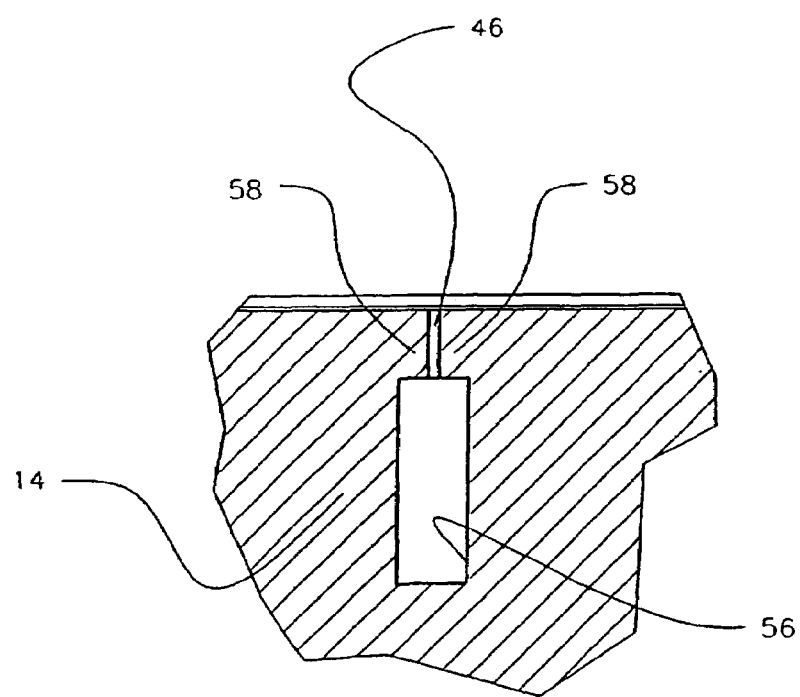
FIG. 11 is a cross-sectional view taken along line 11—11 of FIG. 10.

Another alternative arrangement is shown in FIGS. 10 and 11, in which the drum 14 is provided with a groove 56 that is closed with weld material 58. This weld material 58 is then drilled to form the exit portions 46.

Figure 12:
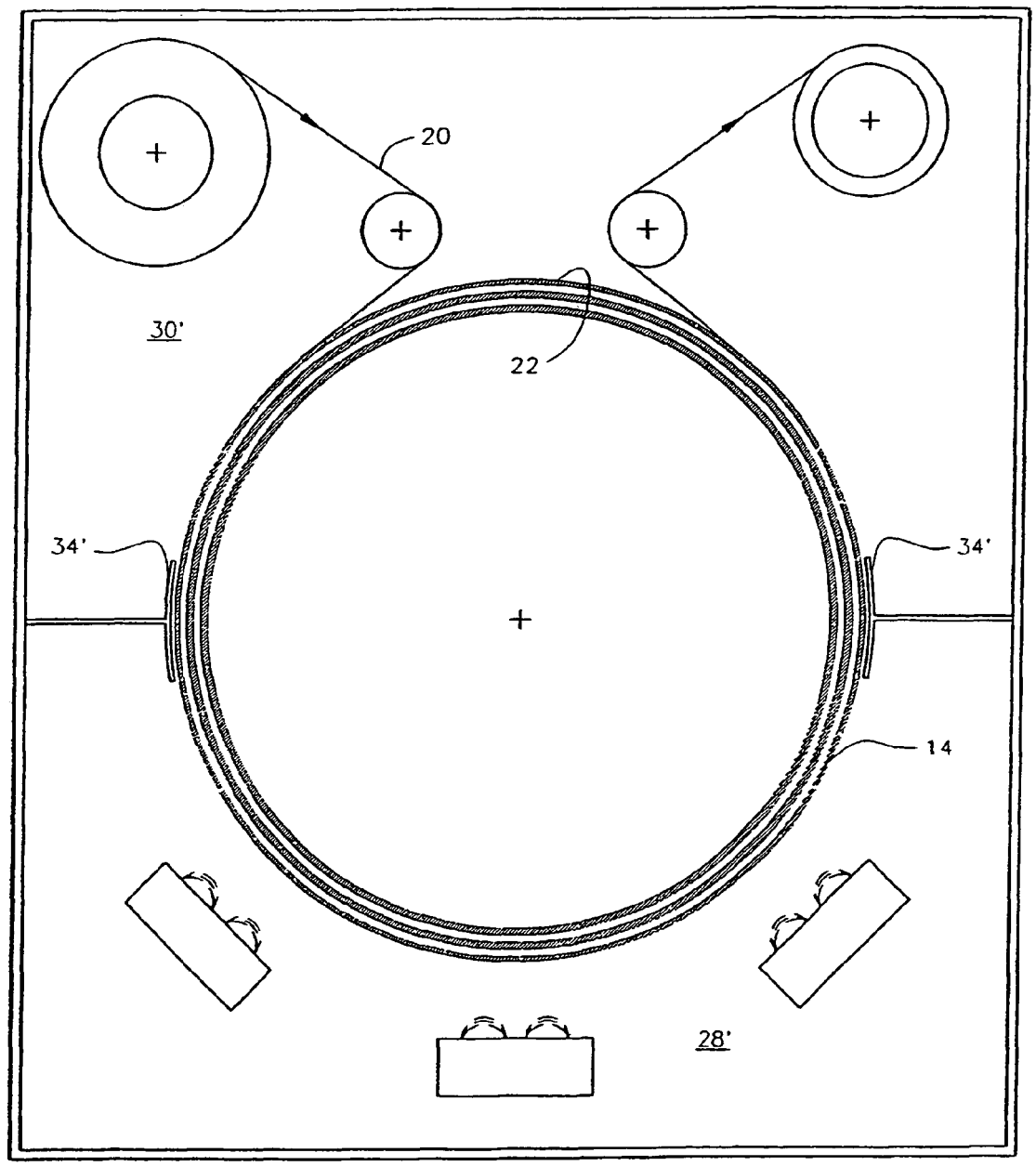
FIG. 12 is a schematic plan view of another preferred embodiment of this invention, in which seals seal against the web rather than the web support surface of the drum.

FIG. 12 relates to another alternative embodiment, in which seals 34' are positioned in close proximity to the web 20, which is in turn is pressed against the web support surface 22. In this embodiment, the seals 34' are positioned over the web 20 rather than the drum 14. As before, the seals 34' define a sealed region 30' that is separated from the coating region 28'. To avoid damage to the web surface, the seals 34' do not contact the web but are positioned in close proximity to the web to limit the gas conductance between sealed region 30' and coating region 28'. In this example, the sealed region 30' includes the entire winding zone, which is maintained at a sufficiently high pressure to force gas via the exposed exit portions into the passages described above. Non-contacting seals of the type shown in FIG. 12 may be used in the embodiment of FIG. 1 instead of the sliding seals 34 to reduce conductance between the drum 14 and the drum cover 32.

Figure 13:
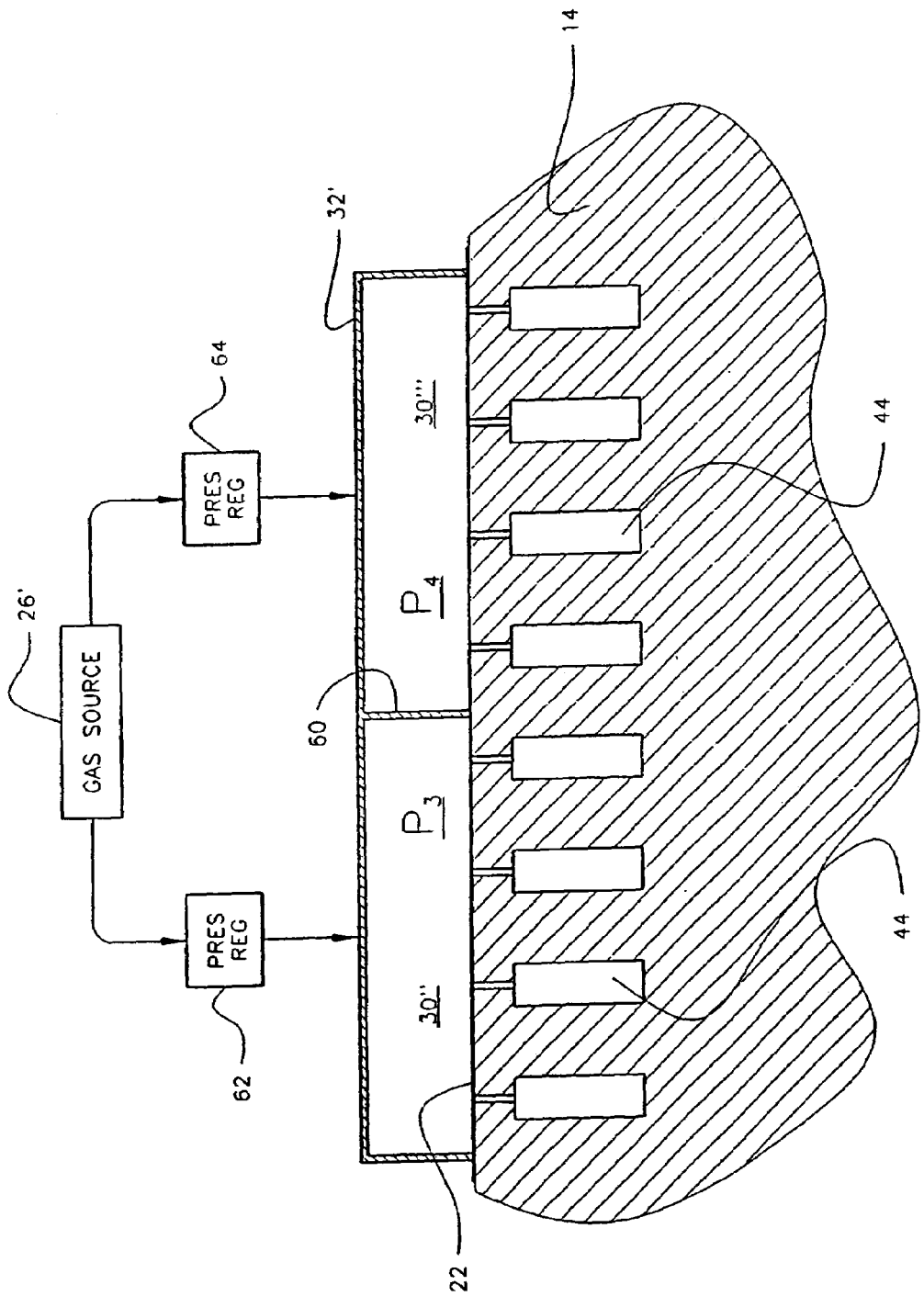
FIG. 13 is a fragmentary schematic sectional view of another embodiment that provides gas at different pressures at different axially spaced regions of the web support surface.

FIG. 13 shows another alternative that is closely related to the embodiment of FIGS. 1 and 2. In this case, the cover 32' includes a septum 60 that divides the region between the drum cover 32' and the drum 14 into two sealed regions 30" and 30'". In this case the gas source 26' supplies pressurized gas to two pressure regulators 62, 64. The pressure regulator 62 is in fluid communication with the sealed region 30", and the pressure regulator 64 is in fluid communication with the sealed region 30'". The septum 60 forms a seal against the web support surface 22, and in this way separate pressures P3, P4 are maintained in the sealed regions 30", 30'" respectively. These different pressures P3, P4 result in a desired pressure distribution along the axial length of the drum 14 in the respective passages 44. Of course, three, four or more sealed regions and associated pressure regulators can be provided to achieve substantially any desired pressure distribution across the width of the web.

The approach shown in FIG. 13 is useful in applications where heat loads on the web are not uniform across the width of the web or where there are specific web transport requirements.

In another variation, the spacing of the passages 44, 44' and the exit portions 46, 46' may be varied to produce desired temperature patterns on the web.

The embodiments described above implement a method for cooling the web 20. The drum 14 is rotated to transport the web 20 past the coating deposition station 24. Pressurized gas is supplied to the passages 44, 44' and the continuously open exit portions 46, 46' conduct this pressurized gas into the region between the web and the drum, thereby improving thermal contact between the web and the drum and cooling of the web. As the drum rotates, individual ones of the exit portions 46, 46' move repeatedly between the coating region and the sealed region. When the exit portions 46, 46' are in the coating region, the web 20 presses against the drum 14 adjacent the exit portions 46, 46' to reduce the leakage of pressurized gas into the coating region 28. When the exit portions 46, 46' are aligned with the sealed region 30, the seals 34, 34' minimize the undesired flow of pressurized gas out of the exit portions 46, 46' into the coating region.

This invention can be adapted for use with the widest variety of drums, vacuum chambers, coating deposition stations, and sources of pressurized gas. All of these elements can be modified widely as appropriate to fit the intended application. For example, the drum can be provided with any desired axial length, and the axial length can be smaller or larger than the diameter of the drum. The angle over which the web is in contact with the drum can also be varied widely, including small angles of wrap (less than 90°) as well as large angles of wrap (greater than 180°). This invention is not limited to any particular material for the web. Steel, plastic or other materials can be used.

Also, the preferred embodiments described above work as intended whether the drum is rotated in the clockwise or the counter clockwise direction. Many vacuum coating devices today include the ability to coat in both directions, and the preferred embodiments described above are well suited for use in such devices.

By way of example only and without intending any limitation on the following claims, the following preferred dimensions and materials have been found suitable in one example. The passages 44 can be provided with cross-sectional dimensions of 10 mm deep by 2 mm wide and a center-to-center spacing along the axial length of the drum of 25 mm. The exit portions 46 can be circular in cross section with a diameter of 0.3 mm and a length of 2 mm. The pressure P1 can be equal to 10 Torr, and the vacuum in the vacuum chamber 12 can be maintained at a pressure of 5×10−4 Torr. The drum 14 can be formed in the conventional manner of carbon steel with a hard, chrome-coated web support surface 22 polished to a roughness average (Ra) of 0.2 micrometers.

As used herein, the term "set" is intended to indicate one or more. The term "substantially prevent" as applied to leakage is intended to indicate reduced leakage at an acceptably low level for the vacuum system being used. The term "source" as applied to pressurized gas includes a source of a single gas at a single pressure as well as a source of one or more gasses at two or more pressures.

The embodiments described above will open new process avenues because an elevated, controlled gas pressure is provided behind the web in a practical manner. The foregoing detailed description has discussed only a few of the many forms that this invention can take. For this reason, this detailed description is intended by way of illustration and not limitation. It is only the following claims, including all equivalents, that are intended to define the scope of this invention.

What is claimed is:

1. A web coating apparatus comprising:
   a rotatable drum comprising a web support surface and a plurality of passages, each passage comprising at least one exit portion positioned in the web support surface, each exit portion being in continuous fluid communication with a region external of and immediately adjacent to the web support surface;
   a source of pressurized gas in fluid communication with the passages;
   a coating deposition station positioned adjacent the web support surface; and
   a set of seals positioned near the web support surface, said set of seals forming a sealed region extending over an arc of the drum angularly spaced from the coating deposition station as the drum rotates relative to the set of seals, said set of seals operative to substantially prevent pressurized gas from escaping from the exit portions in the sealed region to a coating region adjacent the coating deposition station;
   said exit portions cyclically moving through the sealed region and the coating region as the drum rotates;
   wherein each seal seals against the web support surface.

2. The invention of claim 1 further comprising:
   first and second winding hubs rotatably mounted adjacent the drum;
   a web wrapped around the hubs and wrapped partially around the drum on the web support surface in the coating region, said web spaced from the web support surface over at least a major part of the sealed region.

3. The invention of claim 1 further comprising a manifold in fluid communication with the source of pressurized gas, wherein each seal is coupled with the manifold to seal the manifold to the web support surface, and wherein the manifold conducts pressurized gas from the source into the passages via the exit portions in the sealed region.

4. The invention of claim 3 wherein each passage comprises an elongated passage extending circumferentially around the drum and in fluid communication with at least one of the exit portions.

5. The invention of claim 4 wherein the manifold and the elongated passages extend over a working axial width of the drum such that pressurized gas at a substantially uniform, elevated pressure is introduced between the web and the web support surface across the working axial width of the drum.

6. The invention of claim 1 wherein each passage comprises an elongated passage extending circumferentially around the drum and in fluid communication with at least one of the exit portions.

7. The invention of claim 1 wherein each passage comprises an elongated portion extending axially along the drum and in fluid communication with at least one of the exit portions.

8. The invention of claim 1 wherein the exit portions comprise elongated slits.

9. The invention of claim 1 wherein the exit portions comprise tubes.

10. The invention of claim 1 wherein the deposition station comprises multiple deposition sources.

11. The invention of claim 1 wherein the source of pressurized gas comprises a gas pressure regulation system.

12. The invention of claim 1 further comprising a plurality of manifolds, each manifold in fluid communication with the source of pressurized gas at a respective pressure, wherein each seal is coupled with the manifolds to seal the manifolds to the web support surface, and wherein each manifold conducts pressurized gas at the respective pressure into respective ones of the passages via the respective exit portions in the sealed region.

13. A method for coating a web in a web coating process, said method comprising:

(a) providing a coating deposition station and a rotatable drum, said drum comprising a web support surface and a plurality of passages, each passage comprising at least one exit portion positioned in the web support surface, each exit portion being in continuous fluid communication with a region external of and immediately adjacent to the web support surface;

(b) transporting a web pressed against the web support surface past the coating deposition station;

(c) supplying a pressurized gas via the passages and the exit portions into a region between the web and the web support surface, thereby improving thermal contact of the web with the drum; and (d) sealing the exit portions not covered with the web with at least one seal that seals against the web support surface as the drum rotates relative to the seal.

* * * * *

UNITED STATES PATENT AND TRADEMARK OFFICE
CERTIFICATE OF CORRECTION

PATENT NO. : 7,025,833 B2
APPLICATION NO. : 10/471107
DATED : April 11, 2006
INVENTOR(S) : John Madocks and Charles D. Lemme It is certified that error appears in the above-identified patent and that said Letters Patent is hereby corrected as shown below:

Title Page # 75 heading "Inventor", the inventors should be listed as follows:

John Madocks, Tucson, AZ (US)
Charles D. Lemme, Tucson, AZ (US)

Signed and Sealed this

Twenty-second Day of August, 2006

JON W. DUDAS
*Director of the United States Patent and Trademark Office*